(12) United States Patent
Saunders

(10) Patent No.: US 8,665,013 B2
(45) Date of Patent: Mar. 4, 2014

(54) MONOLITHIC INTEGRATED CIRCUIT CHIP INTEGRATING MULTIPLE DEVICES

(75) Inventor: Jeffrey H. Saunders, Andover, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/558,255

(22) Filed: Jul. 25, 2012

(65) Prior Publication Data
US 2014/0028387 A1  Jan. 30, 2014

(51) Int. Cl.
*H01L 25/00* (2006.01)

(52) U.S. Cl.
USPC ......................................................... 327/564

(58) Field of Classification Search
USPC ........... 327/333, 51, 108–112, 170, 389, 391, 327/530, 538, 540–543, 564
See application file for complete search history.

(56) References Cited

U.S. PATENT DOCUMENTS

| 6,344,663 | B1 | 2/2002 | Slater, Jr. et al. | |
| 7,477,102 | B1 | 1/2009 | Ellis et al. | |
| 7,793,712 | B2* | 9/2010 | Yamate et al. | 166/65.1 |
| 2006/0088978 | A1 | 4/2006 | Clarke et al. | |
| 2006/0249792 | A1* | 11/2006 | Kim et al. | 257/355 |
| 2010/0072485 | A1 | 3/2010 | Suda et al. | |
| 2011/0180857 | A1 | 7/2011 | Hoke et al. | |
| 2012/0061681 | A1 | 3/2012 | Thei et al. | |

OTHER PUBLICATIONS

Invitation to Pay Additional Fees and, Where Applicable, Protest Fee for International Application No. PCT/US2013/042760, filed May 24, 2013, Invitation mailed Aug. 8, 2013 (5 pgs.)
Written Opinion of the International Searching Authority for International Application No. PCT/US2013/042760, filed May 24, 2013, Written Opinion of the International Searching Authority mailed Sep. 30, 2013 (9 pgs.).
International Search Report for International Application No. PCT/US2013/042760, filed May 24, 2013, International Search Report dated Jul. 31, 2013 and mailed Sep. 30, 2013 (6 pgs.).

* cited by examiner

*Primary Examiner* — Lincoln Donovan
*Assistant Examiner* — Sibin Chen
(74) *Attorney, Agent, or Firm* — Christie, Parker & Hale, LLP

(57) ABSTRACT

A monolithic integrated circuit (IC) chip containing a plurality of transistors, including: a substrate; a first transistor on the substrate; and a second transistor integrally formed on the substrate with the first transistor, the second transistor having a different structure than the first transistor, wherein the first transistor includes a first material system and the second transistor includes a second material system different from the first material system. The monolithic IC chip may further include a third transistor integrally formed on the substrate with the first and second transistors. The first transistor may include gallium nitride (GaN) and the second and third transistors may include silicon carbide (SiC).

16 Claims, 6 Drawing Sheets

MONOLITHIC INTEGRATED CIRCUIT CHIP INTEGRATING MULTIPLE DEVICES

BACKGROUND

1. Field

One or more aspects of embodiments according to the present invention relate to semiconductor topology, and more particularly to a monolithic integrated circuit (IC) chip that integrates (e.g., monolithically integrates) multiple transistors of different types (e.g., different structures and different material systems) on a single chip.

2. Description of Related Art

Various semiconductor materials may be used to create IC components, including silicon (Si) and silicon carbide (SiC).

While Si is commonly used for electronics, SiC may be used for high-power electronics, because it can withstand both high temperatures and high voltage. Different types of transistors having different structures, such as bipolar junction transistors (BJTs), junction gate field-effect transistors (JFETs), and metal-oxide-semiconductor field-effect transistors (MOSFETs), may be made of SiC. As such, lateral BJTs, JFETs, or MOSFETs made of SiC may be used in ICs for high-power electronics. By contrast, standard complementary metal-oxide-semiconductor (CMOS) circuitry using MOSFETs made of materials other than SiC generally cannot withstand higher voltages. Accordingly, a monolithic IC chip utilizing CMOS technology is not feasible without the use of SiC MOSFETs, which have a higher tolerance to higher voltages.

SUMMARY

It is desirable to provide a semiconductor topology that integrates (e.g., monolithically integrates) multiple devices on a single chip. Therefore, aspects of embodiments of the present invention provide a single monolithic IC chip that permits multiple devices (e.g., transistors) of different structures and different material systems to be combined together on a single substrate. According to another aspect of embodiments of the present invention, a single monolithic IC chip having a higher yield can fit within smaller spaces, such as a unit cell of an X-band panel radar.

In an exemplary embodiment according to the present invention, a monolithic IC chip containing a plurality of transistors includes: a substrate; a first transistor on the substrate; and a second transistor integrally formed on the substrate with the first transistor, the second transistor having a different structure than the first transistor, wherein the first transistor includes a first material system and the second transistor includes a second material system different from the first material system.

The monolithic IC chip may further include a third transistor integrally formed on the substrate with the first and second transistors.

The first transistor may include gallium nitride (GaN) and the second and third transistors may include silicon carbide (SiC).

The first transistor may include a first layer comprised of GaN and a second layer comprised of aluminum gallium nitride (AlGaN) on the first layer.

The first layer may have a thickness of approximately 1 μm to 3 μm.

The second layer may have a thickness of approximately 25 nm.

The first transistor may be a GaN radio or microwave frequency power amplifier and the second transistor may be a drain modulator configured to switch the power amplifier on and off.

The second transistor may include a p-channel FET and an n-channel FET.

The first transistor may be a heterostructure field-effect transistor (HFET).

The third transistor may be a bipolar junction transistor (BJT).

The substrate may be a Si substrate or a SiC substrate.

In another exemplary embodiment according to the present invention, a monolithic IC chip containing a plurality of devices includes: a power amplifier; a level shifter for increasing a voltage from a radar controller to an operating voltage of the chip; a high-speed gate driver for receiving the increased voltage from the level shifter and for driving an FET, wherein the FET is configured to switch the power amplifier on and off; and a detection circuit for sending a signal to the radar controller when the power amplifier is on.

The power amplifier may include GaN.

At least one of the level shifter, the high-speed gate driver, and the FET may include SiC.

The FET may be a p-channel FET or an n-channel FET.

At least one of the level shifter and the high-speed gate driver may include a p-channel PET and an n-channel FET.

BRIEF DESCRIPTION OF THE DRAWINGS

The above and other features and aspects of the present invention will become more apparent by describing in detail exemplary embodiments thereof with reference to the attached drawings.

DETAILED DESCRIPTION

Figure 1:
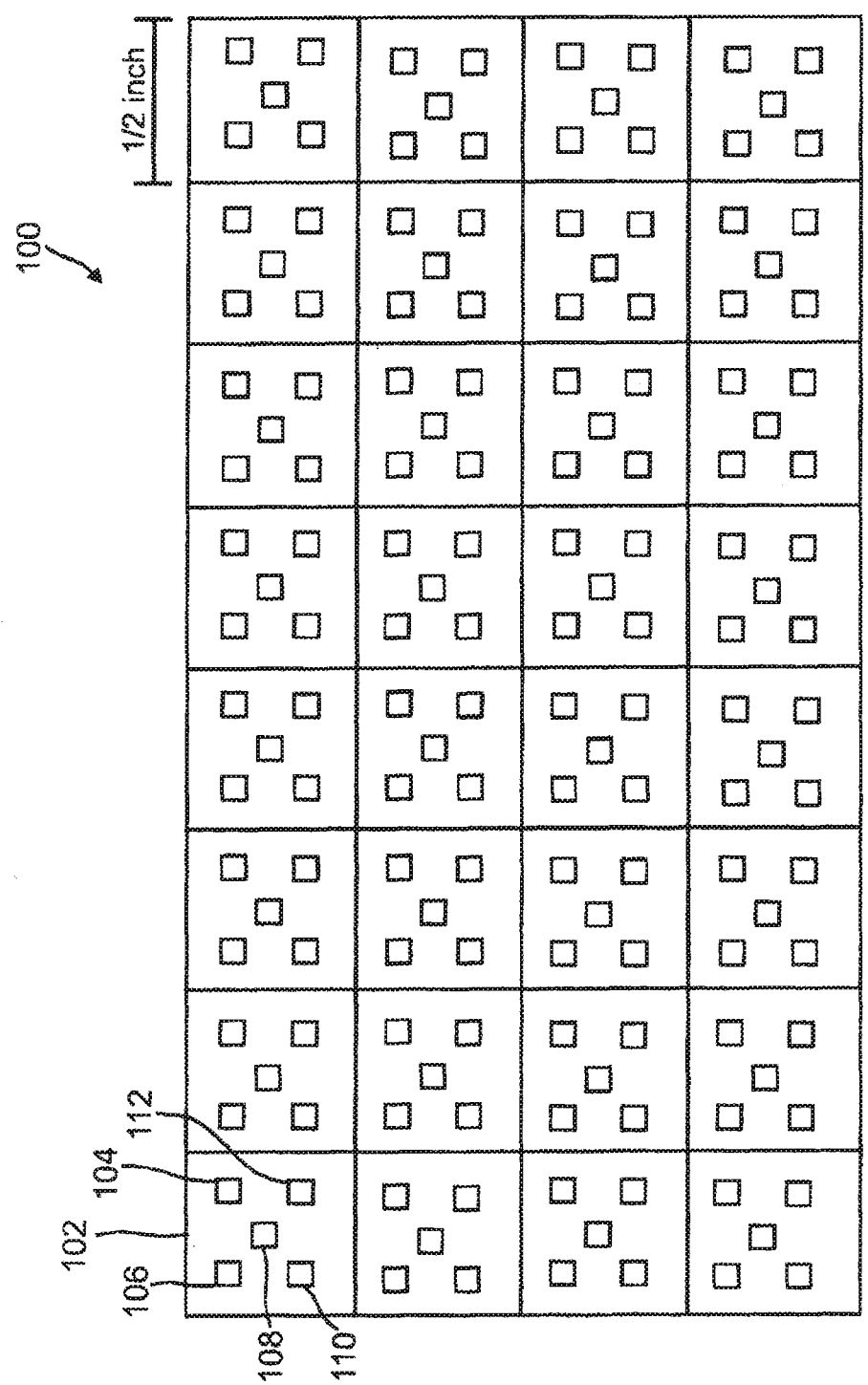
FIG. 1 is a schematic plan view showing a layout of an X-band panel radar.

In embodiments according to the present invention, a single monolithic IC chip includes multiple devices having different structures and different material systems integrated on the same substrate. Embodiments of the present invention will be more clearly understood from the following detailed description taken in conjunction with the accompanying drawings. The drawings are not necessarily drawn to scale. Relative scales and ratios in the drawings may be enlarged or reduced for the purpose of convenience. The scales and ratios in the drawings may be random and are not limited thereto.

In addition to BJTs, JFETs, or MOSFETs, another type of transistor, known as a heterostructure field-effect transistor (HFET), may be used to create an IC. HFETs that are used in high-frequency applications may be made of gallium nitride (GaN), which is a semiconductor material used for high-power and high-frequency devices. For example, transistors made of GaN can operate at higher temperatures and higher voltages than transistors made from other semiconductor materials. As such, GaN transistors may be used, for example, as power amplifiers in high power active electronically scanned arrays (AESAs). AESAs are a type of phased array radar in which transmitter and receiver functions are performed by numerous small solid-state transmit/receive blocks that fit within an array of unit cells (e.g., modules). An AESA steers its "beam" by constructive and deconstructive interference at certain angles in front of an antenna.

Each unit cell contains its own circuitry to perform the transmit and receive functions. A unit cell may be as small as ½ inch by ½ inch, or even smaller depending on the frequency. At higher frequencies, the unit cells are smaller and less space is available because wavelength decreases at higher frequencies and unit cell spacing is a function of wavelength. For example, a C-band panel radar may have a 1 inch by 1 inch size unit cell, while an X-band panel radar may have a ½ inch by ½ inch size unit cell. Accordingly, it may be difficult to fit all of the transmit/receive circuitry within a smaller unit cell.

FIG. 1 is a schematic plan view showing a layout of an X-band panel radar 100. As shown in FIG. 1, each transmit/receive unit cell 102 may include a common leg circuit 104, a Si drain modulator IC 106 (e.g., a drain modulator pulser), a limiter 108, a low-noise amplifier 110, and a power amplifier 112. Power and logic connectors may be connected between unit cells. The power amplifier 112 within each unit cell 102 may operate at a high voltage, for example 28V to 50V. The Si drain modulator IC 106 acts as an on-off switch (e.g., a fast on-off switch) for the power amplifier 112.

Figure 2:
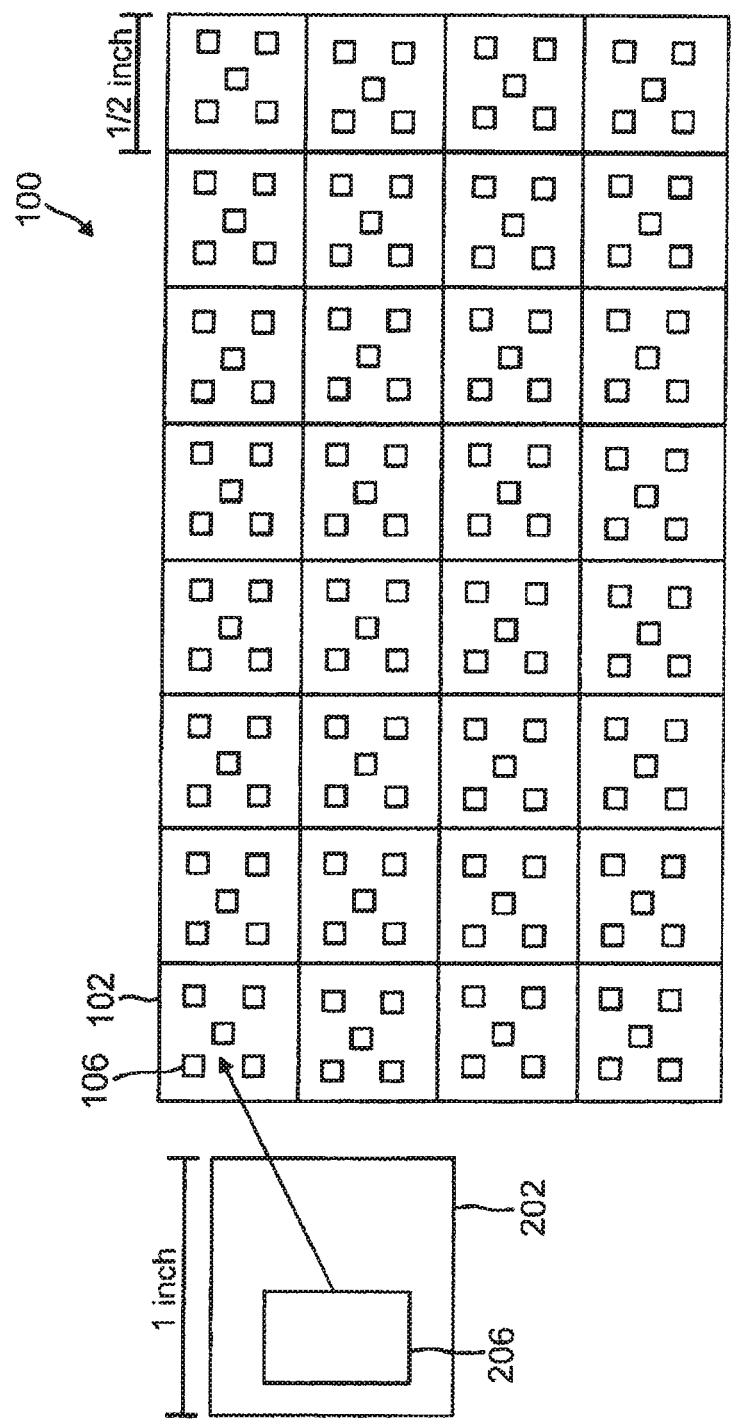
FIG. 2 is a schematic plan view showing a C-band unit cell containing drain modulator circuitry, in the upper left corner, and a layout of an X-band panel radar.

FIG. 2 is a schematic plan view showing a C-band unit cell 202 containing drain modulator circuitry 206, and a layout of an X-band panel radar 100. The drain modulator circuitry 206 in the C-band unit cell 202 is capable of operating at a higher power than the Si drain modulator IC 106 in the X-band panel radar 100, but is larger than the circuitry for a lower power drain modulator. Therefore, as indicated in FIG. 2, the drain modulator circuitry 206 of a C-band panel radar unit cell 202 does not fit within the smaller unit cell 102 of an X-band panel radar 100. Accordingly, there is a need for an IC chip having a higher yield that integrates (e.g., monolithically integrates) multiple devices, including high power devices, and can fit within a smaller space.

High power GaN devices can be formed using Si or SiC substrates. However, a GaN device in an IC is generally integrated with other GaN devices on the same chip. Accordingly, there is a need for an IC chip that integrates (e.g., monolithically integrates) multiple types of devices (e.g., multiple types of transistors having different structures and different material systems) on a single chip.

According to an aspect of the present invention, a single monolithic IC chip combines (e.g., integrally combines) multiple devices of different structures and different material systems on a single chip, which therefore has a higher yield and can fit inside a smaller unit cell of a high frequency AESA.

FIGS. 3 to 6 represent non-limiting, example embodiments as described herein. For example, while embodiments of the present invention are described primarily in reference to GaN transistors and SiC transistors integrated on a SiC substrate, the present invention is not limited thereto. Those skilled in the art would appreciate, based on the disclosure herein, that any other suitable materials and fabrication methods may be used to practice the disclosed embodiments of the present invention. For example, devices of different materials systems may be used, and devices having different structures (e.g., transistors having different structures) may also be used. In addition, the substrate may be made of any number of materials, such as a sapphire substrate or a Si substrate.

Figure 3:
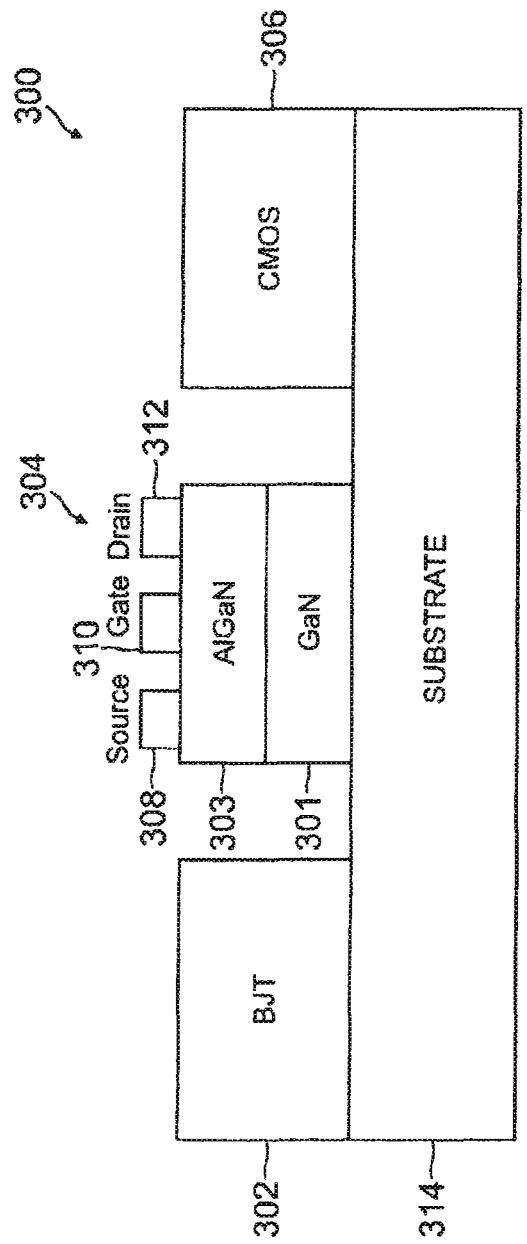
FIG. 3 is a schematic cross-sectional diagram of an integrated structure formed on a substrate according to an embodiment of the present invention.

FIG. 3 is a schematic cross-sectional diagram of an integrated structure formed on a substrate according to an embodiment of the present invention. According to an embodiment, the integrated structure 300 includes a BJT device 302, a GaN device 304, and a CMOS device 306 co-located on the same chip.

According to one embodiment, in the GaN device 304, a GaN layer 301 is formed on the substrate 314 (e.g., SiC substrate) to a thickness of about 1 μm to 3 μm, for example. An aluminum gallium nitride (AlGaN) layer 303 may be formed on the GaN layer 301 to a thickness of about 25 nm, for example. As an example, in one embodiment the Ga source may be trimethylgallium and the N source may be ammonia, but the present invention is not limited thereto. Source, gate and drain contacts 308, 310, and 312 may be formed on the AlGaN layer 303, and respectively correspond to source, gate and drain regions of the GaN device 304.

The CMOS device 306 and the BJT device 302 may be comprised of SiC. The CMOS device 306 may include an n-channel FET (nFET) and a p-channel FET (pFET). In addition, those skilled in the art would appreciate that in view of the different operational voltages required by the CMOS device 306 and the GaN device 304, one or more level shifters (not shown) may be used to interface between the CMOS device 306 and the GaN device 304.

The substrate 314 may have a 4H or 6H crystalline structure and may have a diameter of 4 inches or 6 inches, for example. The substrate 314 may be made of various materials, such as SiC, sapphire or Si. In one embodiment, the substrate 314 is a 4-H SiC substrate that has a high resistivity (e.g., greater than 10 kΩ-cm) and is semi-insulating.

Figure 4:
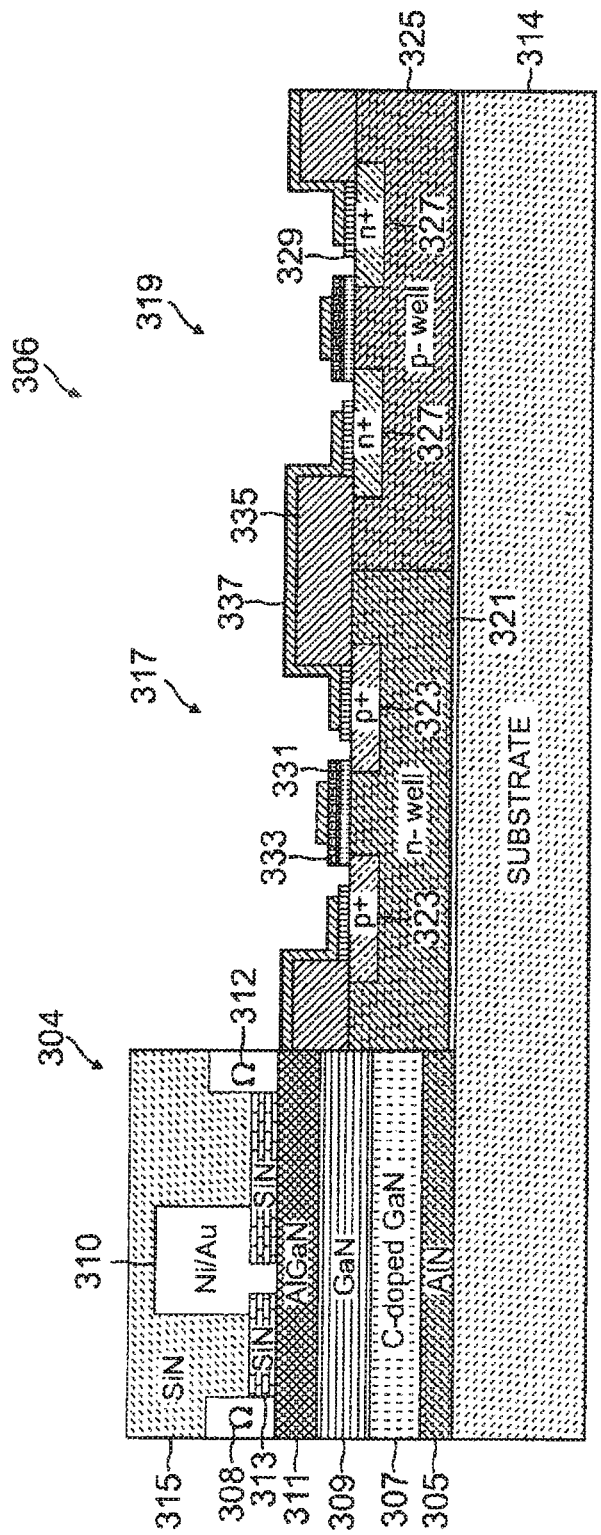
FIG. 4 is a schematic cross-sectional diagram of the GaN device and CMOS device of the integrated structure shown in FIG. 3, according to an embodiment.

FIG. 4 is a schematic cross-sectional diagram of the GaN device 304 and CMOS device 306 of the integrated structure 300 shown in FIG. 3, according to an embodiment. In one embodiment, the GaN device 304 may be a Schottky gate GaN HFET including layers 305, 307, 309, 311, 313, and 315, source contact 308, gate contact 310, and drain contact 312. The layer 305 may be comprised of aluminum nitride (AlN). The layer 307 may be comprised of carbon-doped GaN formed to a thickness of about 500 nm, for example. The layer 309 may be comprised of GaN firmed to a thickness of about 150 nm, for example. The layer 311 may be comprised of AlGaN, with an Al content of about 26%, and formed to a thickness of about 22 nm, for example. The layer 313 may be comprised of silicon nitride (SiN) formed to a thickness of about 50 nm, for example. The gate contact 310 may be comprised of nickel-gold (Ni/Au). The layer 315 may be comprised of SiN formed to a thickness of about 250 nm, for example. However, the embodiment illustrated in FIG. 4 is not limited to any particular material, structure, or thickness described above.

In one embodiment, the CMOS device 306 includes a pFET 317 and an nFET 319. As shown in FIG. 4, the pFET 317 has an n-well 321 and p-type regions 323. The nFET 319 has a p-well 325 and n-type regions 327. An ohmic contact metal layer 329 is formed on each of the p-type regions 323 and the n-type regions 327. The pFET 317 and nFET 319 each have a gate dielectric stack 331 and a gate electrode 333 on the gate dielectric stack 331 between respective p-type regions 323 or n-type regions 327. An oxide layer 335 is formed between the pFET 317 and nFET 319 and is covered by an interconnect metal layer 337. The interconnect metal layer 337 is also formed on each of the gate electrodes 333.

Figure 5:
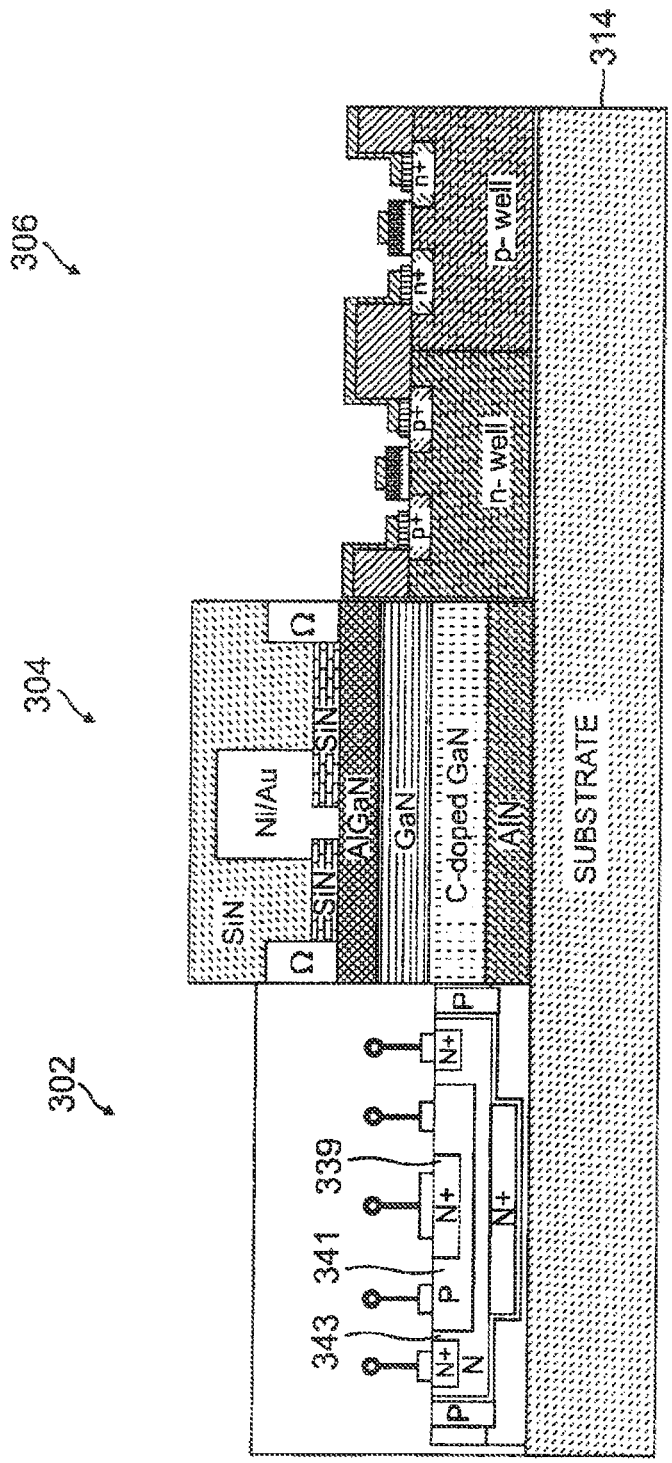
FIG. 5 is a schematic cross-sectional diagram of the BJT device, GaN device, and CMOS device of the integrated structure shown in FIG. 3, according to an embodiment.

FIG. 5 is a schematic cross-sectional diagram of the BJT device 302, GaN device 304, and CMOS device 306 of the integrated structure 300 shown in FIG. 3, according to an embodiment. The GaN device 304, CMOS device 306, and substrate 314 have substantially similar structures to those shown in FIG. 4. In one embodiment, the BJT device 302 includes an emitter region 339, a base region 341, and a collector region 343. The BJT device 302 is an NPN transistor in which the emitter region 339 is an n-type region, the base region 341 is a p-type region, and the collector region 343 is an n-type region. However, embodiments of the present invention are not limited thereto, and the BJT device 302 may be a PNP transistor or may be a device having a different structure such as a JFET or a MOSFET. However, the embodiment illustrated in FIG. 5 is not limited to any particular material, structure, or thickness described above.

Figure 6:
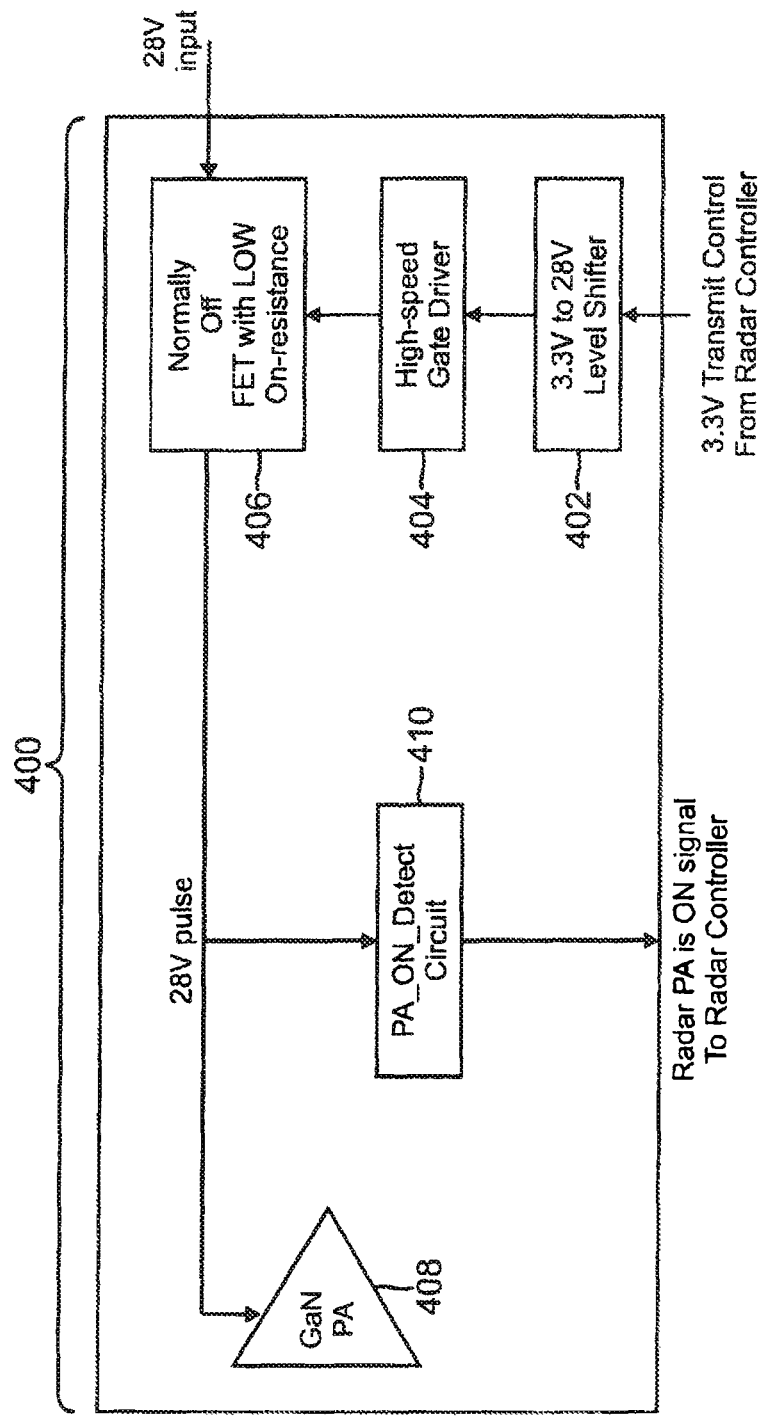
FIG. 6 is a functional block diagram of a single monolithic IC chip according to an embodiment of the present invention.

FIG. 6 is a functional block diagram of a single monolithic IC chip 400 according to an embodiment of the present invention. In an exemplary embodiment, the single monolithic IC chip 400 is located in a unit cell of a high frequency AESA such as an X-band panel radar. The single monolithic IC chip 400 includes a GaN radio or microwave frequency power amplifier 408 and SiC drain modulator circuitry for switching (e.g., quickly switching) the GaN power amplifier 408 on and off. According to an embodiment, the use of GaN for the power amplifier 408 and SiC for the drain modulator circuitry permits the single monolithic IC chip 400 to operate at the higher voltages required by a radar (e.g., 28V to 50V). In one embodiment, the GaN power amplifier 408 is implemented using a GaN HFET. The drain modulator circuitry may be implemented using SiC devices such as SiC MOSFETs.

As shown in FIG. 6, the drain modulator circuitry may include a level shifter 402, a high-speed gate driver 404, an FET 406, and a detection circuit 410. In one embodiment, a voltage such as 3.3V is transmitted from an external radar controller to the level shifter 402 on the chip 400. The level shifter 402 increases the voltage level to an operating voltage level of the chip, such as 28V. The increased voltage level is then transmitted to the high-speed gate driver 404 on the chip, which drives the FET 406 that is a normally off transistor, but when turned on has a low (e.g., very low) resistance. Each of the level shifter 402 and the high-speed gate driver 404 may be implemented as a SiC CMOS-based FET such as the CMOS device 306 shown in FIG. 4, which includes both an nFET and a pFET. The FET 406, which may be either an nFET or a pFET, transmits a 28V pulse to the GaN power amplifier 408 when turned on. The drain modulator circuitry may further include a detection circuit 410, which sends a signal to the external radar controller indicating that the GaN power amplifier 408 is on.

As such, in exemplary embodiments according to the present invention, both CMOS and GaN devices are monolithically integrated on the same SiC substrate. Examples of a similar integration on a Si substrate are provided, for example, in U.S. Pre-Grant Publication No. 2011/0180857 entitled "Structure Having Silicon CMOS Transistors with Column III-V Transistors on a Common Substrate," the entire content of which is incorporated by reference herein.

Hence, various combinations of devices having different structures and different material systems may be integrated (e.g., monolithically integrated) on a single chip. In addition, the chip may operate at high voltages, such as those required by a radar, and the transmit/receive circuitry can fit within a smaller unit cell of a high frequency radar.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A monolithic integrated circuit (IC) chip containing a plurality of transistors, comprising:
    a substrate;
    a first transistor on the substrate;
    a second transistor integrally formed on the substrate with the first transistor, the second transistor having a different structure than the first transistor; and
    a third transistor integrally formed on the substrate with the first and second transistors and having a different structure than the first transistor and the second transistor,
    wherein the first transistor comprises a first material system and the second transistor comprises a second material system different from the first material system, and
    wherein the first, second and third transistors are selected from the group consisting of a bipolar junction transistor, a junction field effect transistor, a heterostructure field effect transistor, and a metal-oxide-semiconductor field effect transistor.

2. The monolithic IC chip of claim 1, wherein the first transistor comprises gallium nitride (GaN) and the second and third transistors comprise silicon carbide (SiC).

3. The monolithic IC chip of claim 2, wherein the first transistor comprises a first layer comprised of GaN and a second layer comprised of aluminum gallium nitride (AlGaN) on the first layer.

4. The monolithic IC chip of claim 3, wherein the first layer has a thickness of approximately 1 µm to 3 µm.

5. The monolithic IC chip of claim 3, wherein the second layer has a thickness of approximately 25 nm.

6. The monolithic IC chip of claim 2, wherein the first transistor is a GaN radio or microwave frequency power amplifier and the second transistor is a drain modulator configured to switch the power amplifier on and off.

7. The monolithic IC chip of claim 2, wherein the second transistor comprises a p-channel FET and an n-channel FET.

8. The monolithic IC chip of claim 7, wherein the first transistor is a heterostructure field-effect transistor (HFET).

9. The monolithic IC chip of claim 8, wherein the third transistor is a bipolar junction transistor (BJT).

10. The monolithic IC chip of claim 1, wherein the substrate is a Si substrate or a SiC substrate.

11. A monolithic integrated circuit (IC) chip containing a plurality of devices, comprising:
    a power amplifier;
    a level shifter for increasing a voltage from a radar controller to an operating voltage of the chip;
    a high-speed gate driver for receiving the increased voltage from the level shifter and for driving an FET, wherein the FET is configured to switch the power amplifier on and off; and
    a detection circuit for sending a signal to the radar controller when the power amplifier is on.

12. The monolithic IC chip of claim 11, wherein the power amplifier comprises GaN.

13. The monolithic IC chip of claim 12, wherein at least one of the level shifter, the high-speed gate driver, and the FET comprises SiC.

14. The monolithic IC chip of claim 13, wherein the FET is a p-channel FET or an n-channel FET.

15. The monolithic IC chip of claim 13, wherein at least one of the level shifter and the high-speed gate driver comprise a p-channel FET and an n-channel FET.

16. A monolithic integrated circuit (IC) chip containing a plurality of transistors, comprising:
    a substrate;
    a first transistor on the substrate;
    a second transistor integrally formed on the substrate with the first transistor, the second transistor having a different structure than the first transistor; and
    a third transistor integrally formed on the substrate with the first and second transistors,
    wherein the first transistor comprises a first material system and the second transistor comprises a second material system different from the first material system,
    wherein the first transistor comprises gallium nitride (GaN) and the second and third transistors comprise silicon carbide (SiC), and
    wherein the first transistor comprises a first layer comprised of GaN and a second layer comprised of aluminum gallium nitride (AlGaN) on the first layer.

* * * * *